United States Patent [19]

Schwartz et al.

[11] Patent Number: 4,654,781
[45] Date of Patent: Mar. 31, 1987

[54] BYTE ADDRESSABLE MEMORY FOR VARIABLE LENGTH INSTRUCTIONS AND DATA

[75] Inventors: Martin J. Schwartz, Worcester; H. Frank Howes, Fayville; Richard J. Edry, Ashland, all of Mass.

[73] Assignee: Raytheon Company, Lexington, Mass.

[21] Appl. No.: 665,510

[22] Filed: Oct. 30, 1984

Related U.S. Application Data

[63] Continuation of Ser. No. 308,006, Oct. 2, 1981, abandoned.

[51] Int. Cl.⁴ ............................................. G06F 12/04
[52] U.S. Cl. ....................................................... 364/200
[58] Field of Search ... 364/200 MS File, 900 MS File

[56] References Cited

U.S. PATENT DOCUMENTS

| | | | |
|---|---|---|---|
| 3,717,851 | 2/1973 | Cocke et al. | 364/200 |
| 4,020,470 | 4/1977 | Drimak et al. | 340/172.5 |
| 4,079,451 | 3/1978 | Woods et al. | 364/200 |
| 4,092,728 | 5/1978 | Baltzer | 364/900 |
| 4,099,229 | 7/1978 | Kancler | 364/200 |
| 4,099,253 | 7/1978 | Dooley, Jr. | 364/900 |
| 4,109,310 | 8/1978 | England et al. | 364/200 |
| 4,131,940 | 12/1978 | Moyer | 364/200 |
| 4,135,242 | 1/1979 | Ward et al. | 364/200 |
| 4,150,364 | 4/1979 | Baltzer | 340/703 |
| 4,156,905 | 5/1979 | Fassbender | 364/200 |
| 4,219,874 | 8/1980 | Gusev et al. | 364/200 |
| 4,514,808 | 4/1985 | Murayama et al. | 364/200 |

FOREIGN PATENT DOCUMENTS

| | | |
|---|---|---|
| 0032136 | 1/1980 | European Pat. Off. |
| 0056008 | 1/1981 | European Pat. Off. |
| 1178065 | 4/1966 | United Kingdom. |
| 1449229 | 10/1972 | United Kingdom. |

Primary Examiner—Eddie P. Chan
Attorney, Agent, or Firm—Walter F. Dawson; Richard M. Sharkansky

[57] ABSTRACT

A random access memory having the capability to access one or more bytes in one or more memory word locations of a multi-byte memory array within one memory cycle. Variable length instruction and data words composed of multiple bytes are stored in a block of addressable locations in a memory so that individual bytes of each word are aligned in columns. Each column of bytes is addressable independently of the other byte columns via adders. A most significant bit portion of a memory location address is fed into a first input of column adders and the output of a first decoder circuit is fed into a second input of the adders for address incrementing within one memory cycle. A second decoder circuit generates a separate read or write enable line to each column of bytes. Both decoders are controlled by a least significant bit portion of the memory address and reference word byte size codes. A bi-directional multiplexer rearranges the order of the bytes so they appear in the proper order at the memory interface.

11 Claims, 10 Drawing Figures

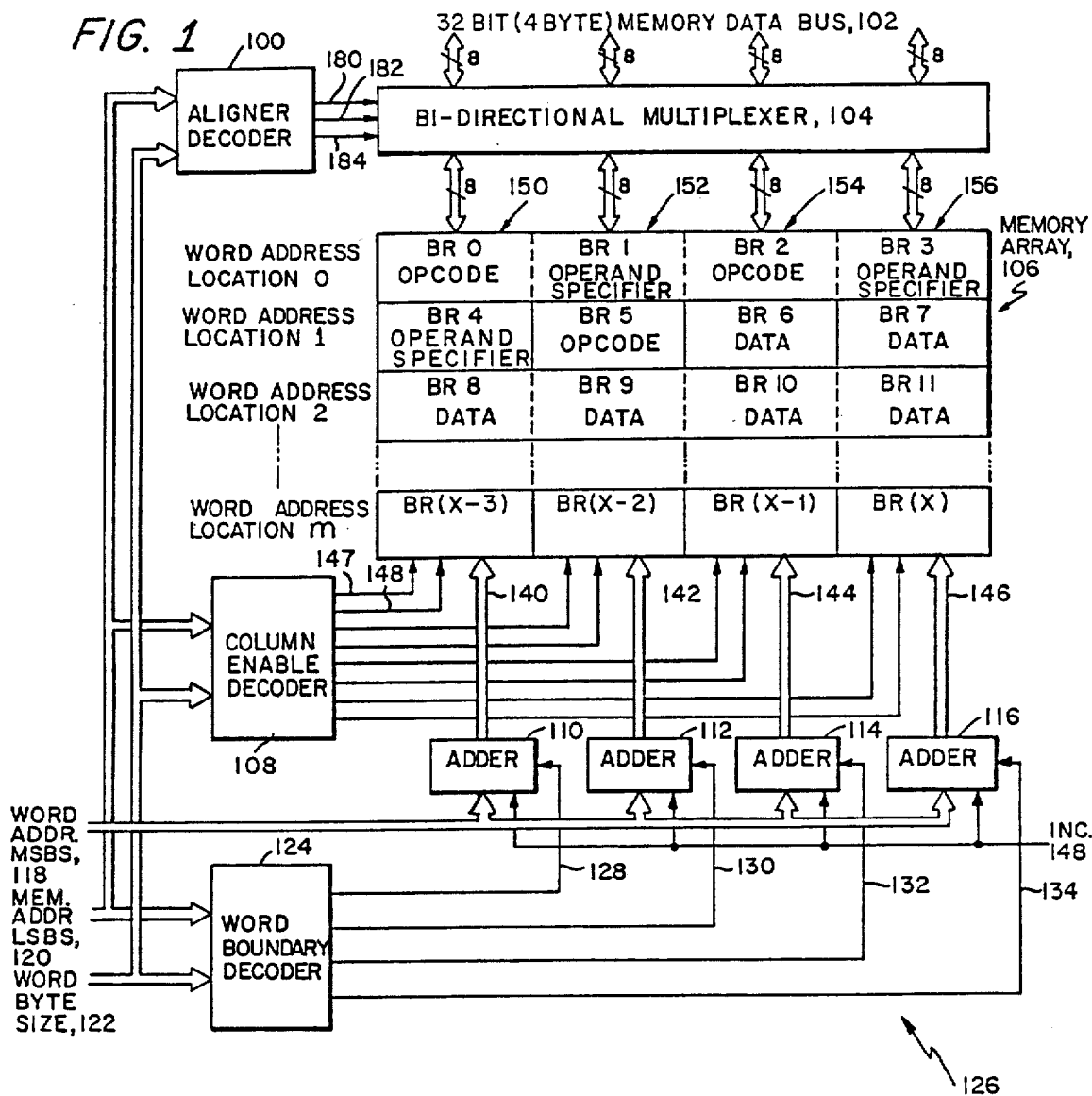
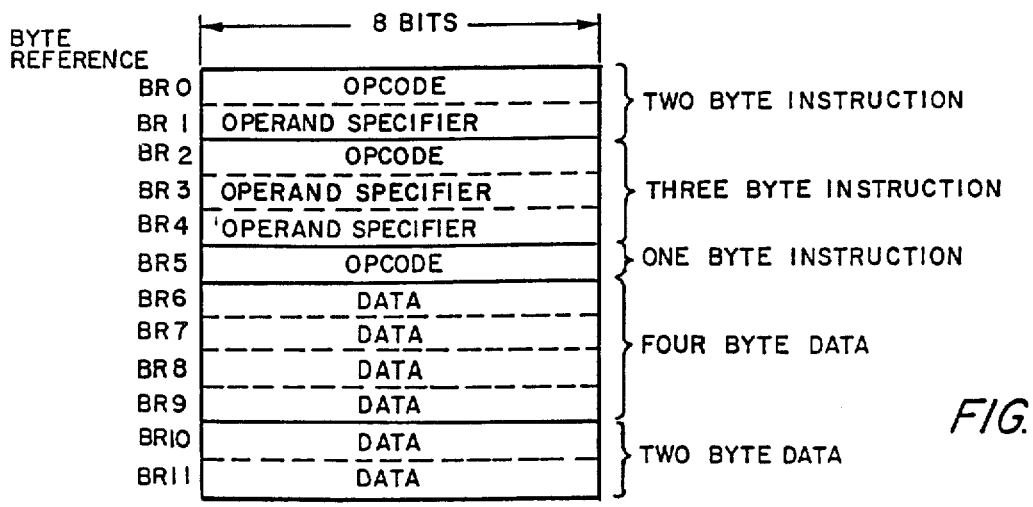

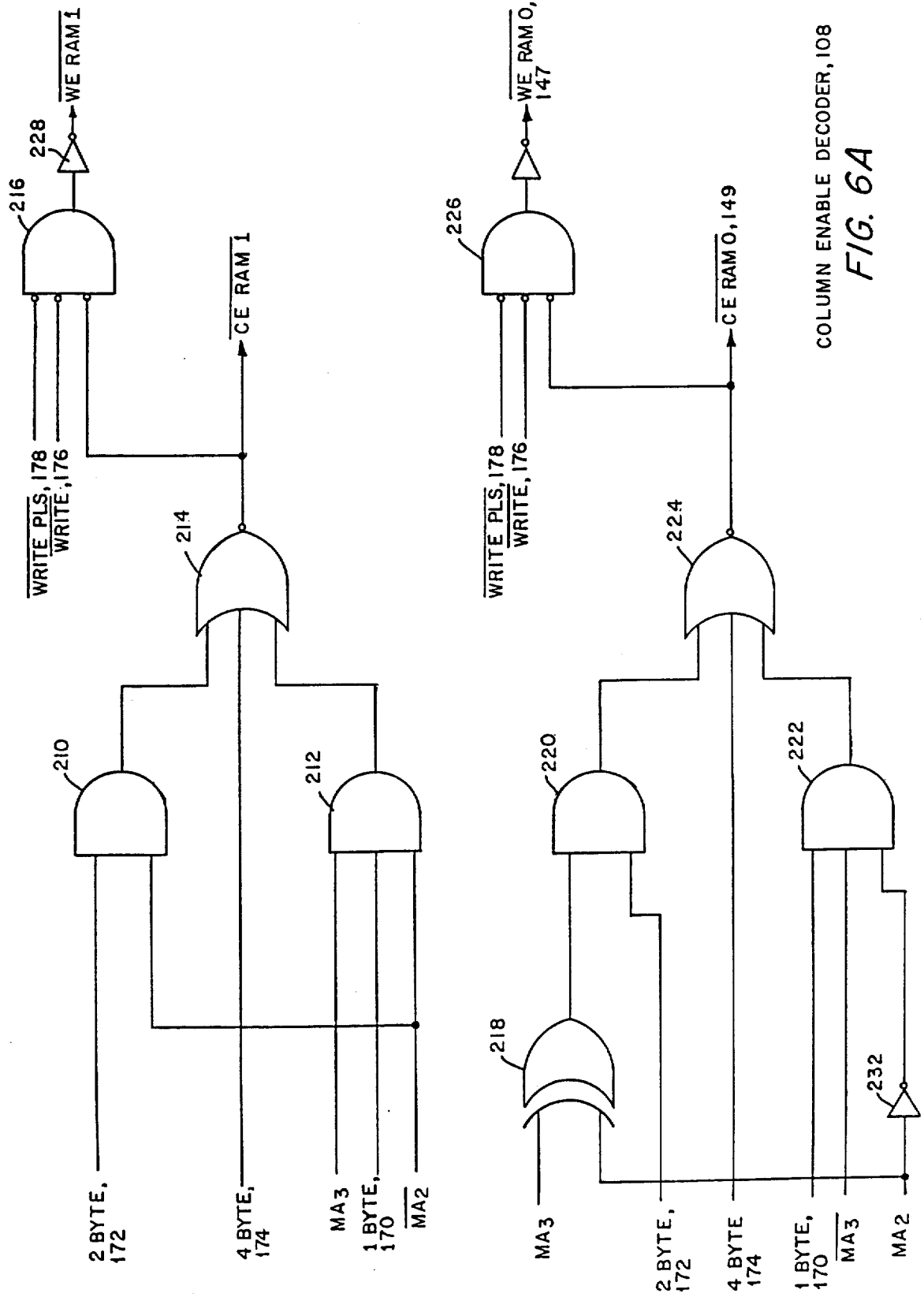

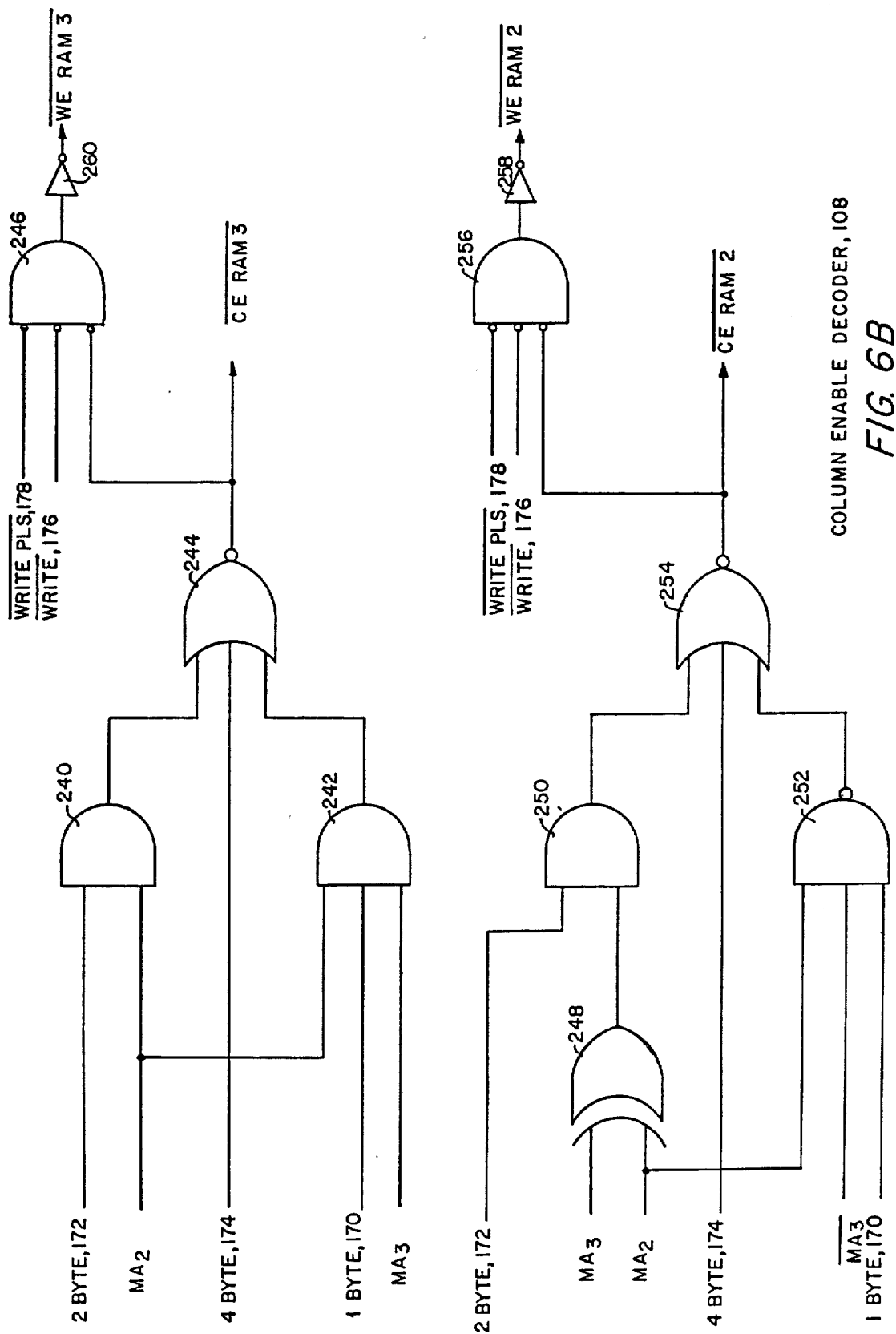
FIG. 6B  COLUMN ENABLE DECODER, 108

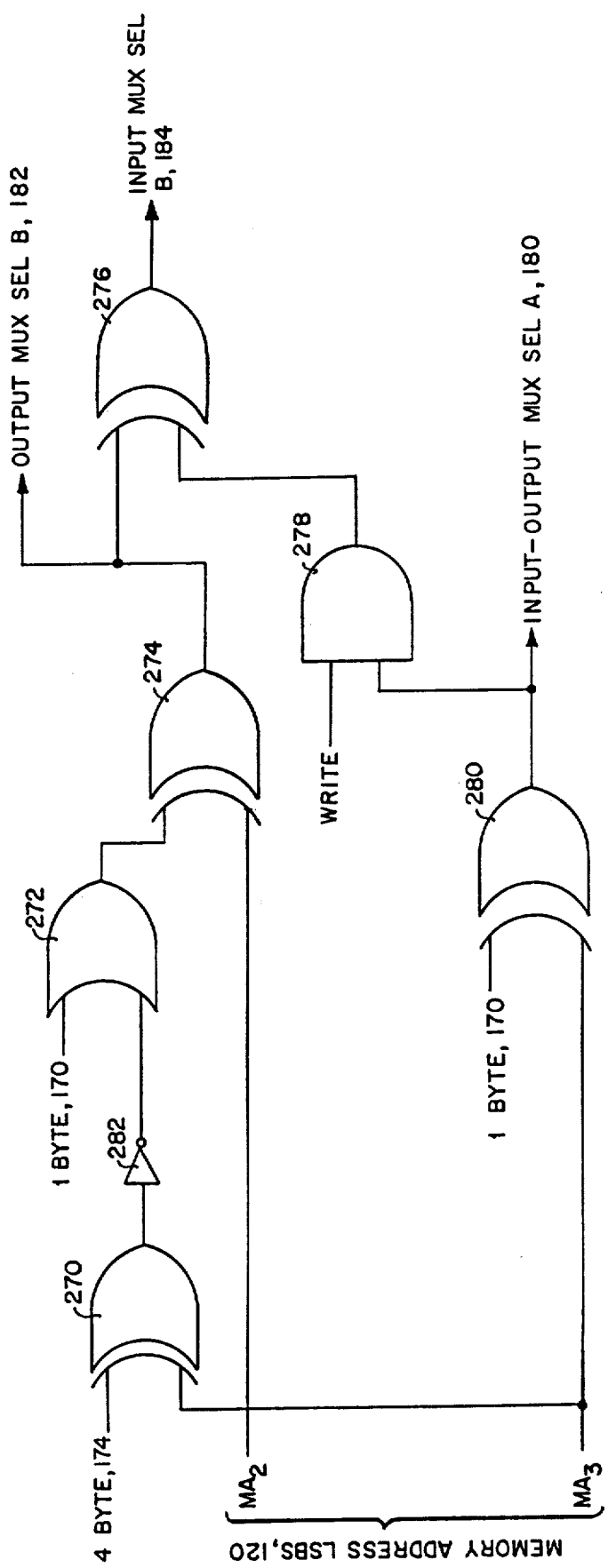

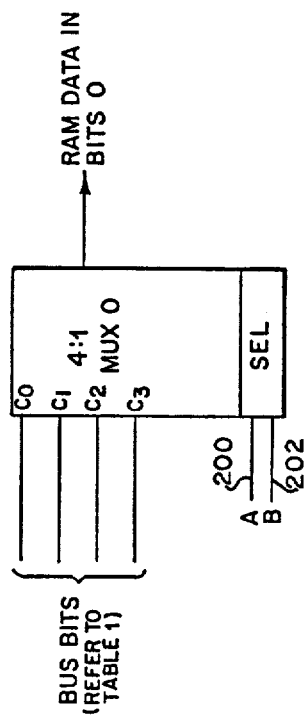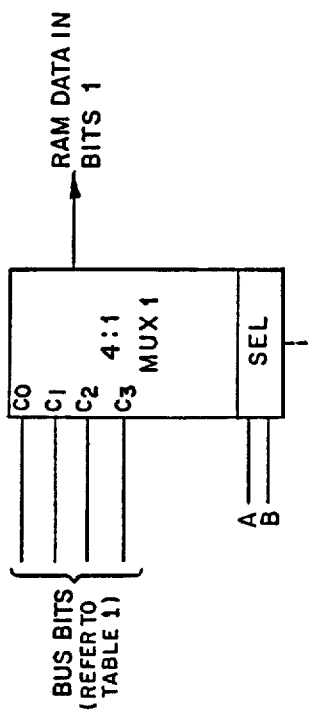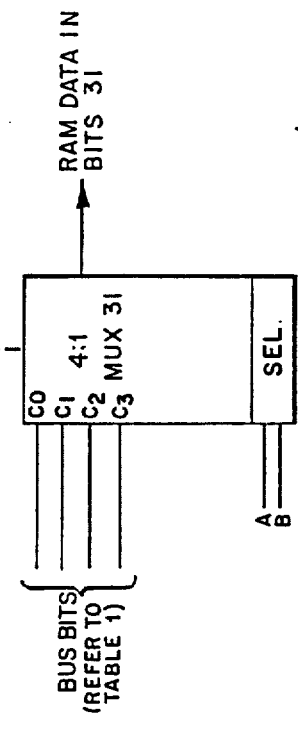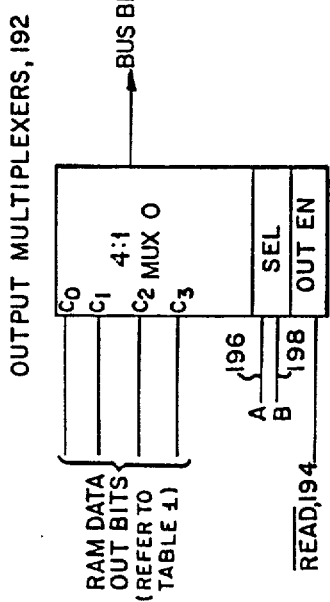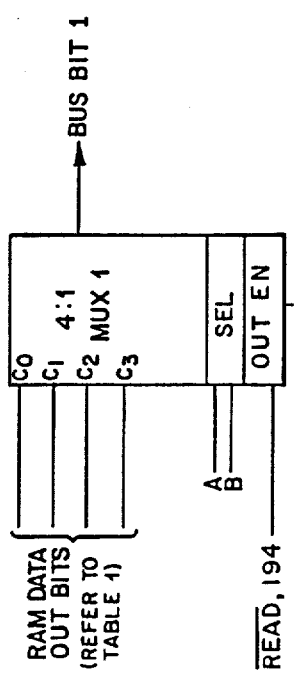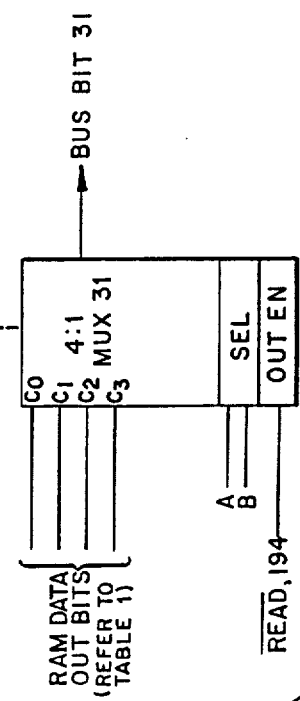
FIG. 8

| TABLE 1 | | | | |
|---|---|---|---|---|
| IN/OUT MULTIPLEXERS | BUS/RAM BIT | | | |
| | $c_0$ | $c_1$ | $c_2$ | $c_3$ |
| MUX0 | 0 | 24 | 16 | 8 |
| MUX1 | 1 | 25 | 17 | 9 |
| MUX2 | 2 | 26 | 18 | 10 |
| MUX3 | 3 | 27 | 19 | 11 |
| MUX4 | 4 | 28 | 20 | 12 |
| MUX5 | 5 | 29 | 21 | 13 |
| MUX6 | 6 | 30 | 22 | 14 |
| MUX7 | 7 | 31 | 23 | 15 |
| MUX8 | 8 | 0 | 24 | 16 |
| MUX9 | 9 | 1 | 25 | 17 |
| MUX10 | 10 | 2 | 26 | 18 |
| MUX11 | 11 | 3 | 27 | 19 |
| MUX12 | 12 | 4 | 28 | 20 |
| MUX13 | 13 | 5 | 29 | 21 |
| MUX14 | 14 | 6 | 30 | 22 |
| MUX15 | 15 | 7 | 31 | 23 |
| MUX16 | 16 | 8 | 0 | 24 |
| MUX17 | 17 | 9 | 1 | 25 |
| MUX18 | 18 | 10 | 2 | 26 |
| MUX19 | 19 | 11 | 3 | 27 |
| MUX20 | 20 | 12 | 4 | 28 |
| MUX21 | 21 | 13 | 5 | 29 |
| MUX22 | 22 | 14 | 6 | 30 |
| MUX23 | 23 | 15 | 7 | 31 |
| MUX24 | 24 | 16 | 8 | 0 |
| MUX25 | 25 | 17 | 9 | 1 |
| MUX26 | 26 | 18 | 10 | 2 |
| MUX27 | 27 | 19 | 11 | 3 |
| MUX28 | 28 | 20 | 12 | 4 |
| MUX29 | 29 | 21 | 13 | 5 |
| MUX30 | 30 | 22 | 14 | 6 |
| MUX31 | 31 | 23 | 15 | 7 |

FIG. 9

BYTE ADDRESSABLE MEMORY FOR VARIABLE LENGTH INSTRUCTIONS AND DATA

This application is a continuation of application Ser. No. 308,006 filed Oct. 2, 1981 now abandoned.

BACKGROUND OF THE INVENTION

This invention relates to a random access memory and more particularly to apparatus for transferring one or more bytes of a digital word to and from one or more memory locations within one memory cycle.

A computer or data processing system usually comprises a memory subsystem having a plurality of memory locations for the storage of digital words made up of a specific number of bits such as 8, 16, 24 or 32. The computer architecture for some prominent 32 bit general register machines employs variable length instructions represented by a sequence of bytes with the first byte specifying the operation to be performed and succeeding bytes specifying the operands. Each operand may be 8, 16, 32, or even 64 bits. Storage of a mixture of variable length instructions and data in a 32 bit word memory achieves maximum utilization of the memory storage space available if, for example, part of a 32 bit instruction or data word is stored in the same location as a 16 bit instruction or data word and the remainder in a subsequent memory location.

In the prior art, efficient utilization of memory space has been accomplished by a combination of hardware and software techniques. However, more than one memory cycle has been required when part of an instruction or data word was stored in one memory location and the other part stored in another memory location. The result has been that efficient utilization of memory space is accomplished, but the processing speed of the computer is reduced. Using this invention as local storage, that is storage associated with a central processing unit as opposed to the main storage of a data processing system, conventional main storage still can be used while achieving the benefits of making multi-byte accesses within one memory cycle in local storage.

SUMMARY OF THE INVENTION

This invention discloses a memory having stored therein different length digital words in different addressable locations, each one of the addressable locations comprising a plurality of byte positions with a first byte position starting at any one of said byte positions. The storage element is a read-write random access memory array or it also may be a preprogrammed read-only memory array in which case a writing means for the array is not needed. The readwrite memory comprises means for addressing any one or more of the bytes within a memory location, means for writing one or more bytes of a digital word into a first memory location of a memory array and the balance of the bytes into a second memory location of the memory array within one memory cycle, and means for reading one or more bytes of a digital word from a first memory location of a memory array and the balance of the bytes from a second memory location of the memory array within one memory cycle. In addition, there are means for aligning the bytes in a preferred order when writing into or reading from the memory which comprises an aligner decoder and a bi-directional multiplexer. The memory further comprises adders for incrementing the address of a memory location during one memory cycle and a decoder for determining the number of bytes in a referenced digital word. The capability is also provided for writing or reading eight bytes of a digital word into or from three memory locations of the memory array within two memory cycles.

This invention further discloses a memory having stored therein different length digital words in different locations, each one of the locations comprising a plurality of byte positions with a first byte of a digital word starting at any one of the byte positions; the memory is provided with a first digital word representing the most significant bits of a memory location address, with a second digital word representing the least significant bits of a memory location address and with a third digital word representing the number of bytes in a memory reference. The memory includes means for incrementing the first digital word to provide more than one memory location access during one memory cycle, first decoding means responsive to the second digital word and the third digital word for producing a control signal for the incrementing means, second decoding means responsive to the second digital word and the third digital word for providing column enable signals for selecting specific byte positions in the memory means, third decoding means responsive to the second digital word and the third digital word for producing control signals for aligning the order of bytes to or from the memory means, means for transferring memory data words to or from the memory means and responsive to the byte ordering control signals from the third decoding means. There are also means for incrementing the first digital word at least twice within two memory cycles for writing or reading eight bytes of a digital word into or from three memory locations of said memory array. Each of the locations of the memory means comprises a plurality of bytes and the number of the least significant bits forming said second digital word is determined by the $\log_2 N$ where N equals the number of bytes in a memory data word location of the memory means.

The invention further discloses the method of referencing one or more bytes in a word organized memory comprising the steps of storing different length digital words in different addressable locations, each one of the locations comprising a plurality of byte positions with a first byte of a digital word starting at any one of the byte positions, incrementing an address of a memory location for providing more than one memory location access during one memory cycle, writing one or more of the bytes of a digital word into a memory location within one memory cycle, reading one or more of the bytes of a digital word from a memory location within one memory cycle, writing one or more of the bytes of a digital word into a first memory location of a memory array and the balance of the bytes into a second memory location of the memory array within one memory cycle, reading one or more of the bytes of a digital word from a first memory location of a memory array and the balance of said bytes from a second memory location of the memory array within one memory cycle, and aligning the bytes in a preferred order when writing into or reading from the memory. The steps of writing into or reading from more than one memory location within one memory cycle comprise incrementing a word address of the first memory location. The step of incrementing the word address of a memory location includes using an adder. The step of aligning the bytes in a preferred order includes using an aligner decoder for generating control signals for arranging the order of the bytes in a digital word. The step of aligning the bytes in a preferred order further includes a bi-directional multiplexer responsive to the aligner decoder control signals for transferring and aligning data to or from the memory.

BRIEF DESCRIPTION OF THE DRAWINGS

Other and further features and advantages of the invention will become apparent in connection with the accompanying drawings wherein:

FIG. 1 is a block diagram of the byte addressable memory invention; and

FIG. 2 is a memory map with byte references for a list of exemplary variable length instructions with variable number of operands and different byte size data types.

FIG. 6A is a logic diagram of a first portion of the column enable decoder shown in FIG. 1;

FIG. 6B is a logic diagram of a second portion of the column enable decoder shown in FIG. 1;

FIG. 7 is a logic diagram of the aligner decoder shown in FIG. 1;

FIG. 8 is a block diagram of the bi-directional multiplexer shown in FIG. 1; and FIG. 9 is a table of the connections for the bi-directional multiplexer as shown in FIG. 8 indicating which memory bus bits are connected to each input multiplexer and which RAM data out bits are connected to each output multiplexer.

DESCRIPTION OF THE PREFERRED EMBODIMENT

Figure 3:
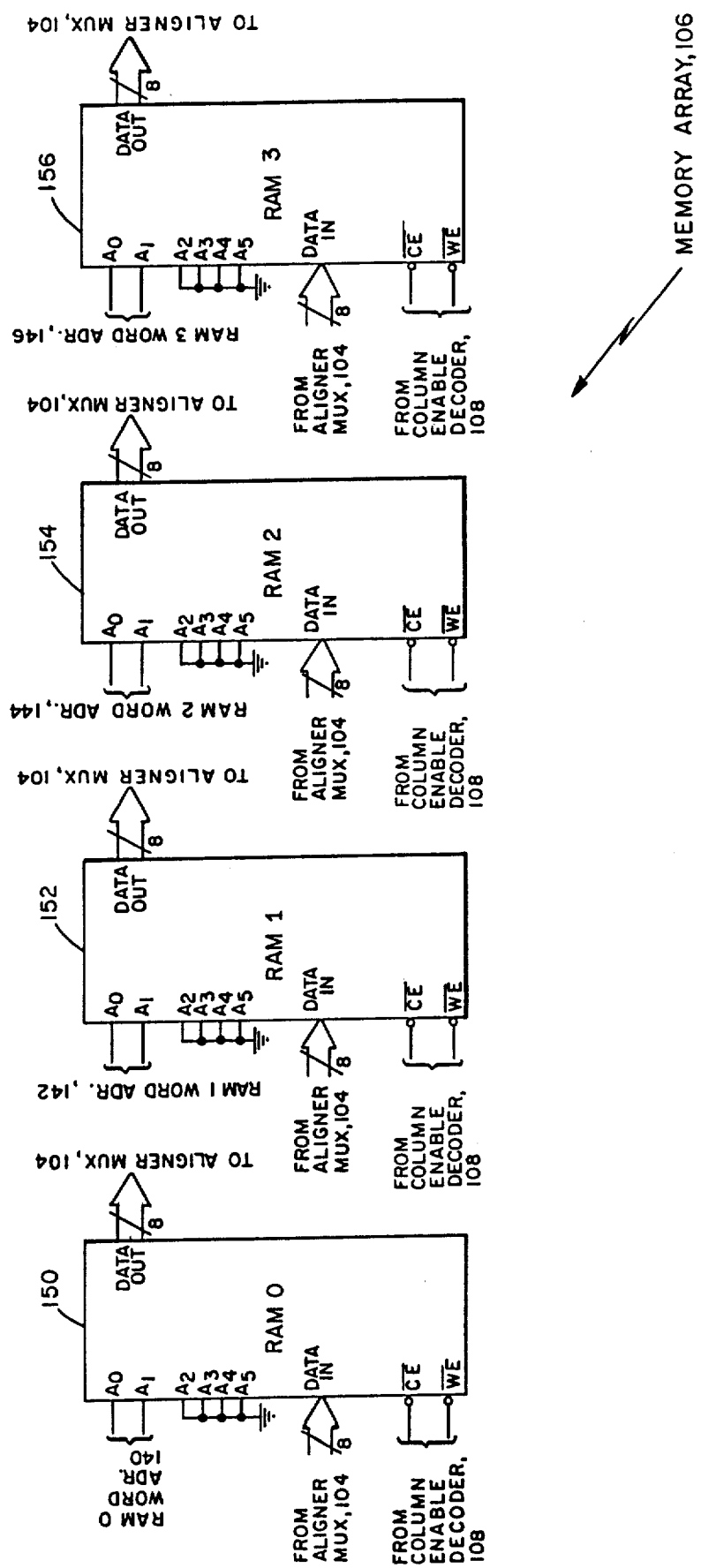
FIG. 3 is a block diagram of the memory array shown in FIG. 1.

Referring now to FIG. 1, there is shown in block diagram for a word organized, byte addressable, random access memory 126. The storage element or Memory Array 106 in the preferred embodiment is implemented with a plurality of semiconductor random access memory (RAM) devices. Information in the form of a 32 bit parallel digital word is transferred on a 32 Bit (4 byte) Memory Data Bus 102, to and from the Memory Array 106 via a Bi-directional Multiplexer 104. The digital word size of a storage location in Memory Array 106 is 32 bits with four byte reference (BR) positions per location and the number of memory locations "m" is variable depending on the size of the RAM devices used to implement Memory Array 106 and the storage needs for various applications. Three memory locations are illustrated in FIG. 1 containing a mixture of variable or different word length instructions and data. Memory Array 106 is defined to be word organized and byte addressable with instructions and data aligned on arbitrary byte boundaries.

The location or locations in memory to be addressed or referenced are determined by the Word Address MSBS 118, Memory Address LSBS 120 and Word Byte Size 122 input signals. The number of Memory Address LSBS 120 signals is determined by the $\log_2 N$ where N = number of bytes in a memory location word. In the preferred embodiment shown in FIG. 1, there are four bytes per word so the Memory Address LSBS 120 signals consists of the two least significant bits of the memory address. A maximum of 4 bytes may be referenced in one memory cycle. The remaining memory address bits make up the Word Address MSBS 118 signals. The Word Byte Size 122 signals determine the number of bytes in the particular memory location being addressed in memory which is generally 1, 2 or 4 bytes. However, 8 bytes may be addressed in two memory cycles as discussed subsequently. The Word Address MSBS 118 signals connect to each of the Adders 110, 112, 114 and 116. The Memory Address LSBS 120 and the Word Byte Size 122 signals connect to a Word Boundary Decoder 124 which determines when the digital word being addressed is partly contained in two successive memory locations requiring a second memory location to be addressed; they also connect to an Aligner Decoder 100 the outputs of which connect to the Bi-directional Multiplexer 104. The combination of the Aligner Decoder 100 and the Bi-directional Multiplexer 104 controls the order of the bytes in a digital word being transferred to and from Memory Array 106. In addition, the Memory Address LSBS 120 and the Word Byte Size 122 signals also connect to a Column Enable Decoder 108 which selects the columns or bytes within a memory location of Memory Array 106 that are being addressed.

Referring now to FIG. 2, twelve bytes of digital information are listed illustrating a typical mixture of variable length instructions with variable numbers of operand specifiers and variable size data types which may be 8, 16, 32 or 64 bits long that may be stored in a Memory Array 106. The memory map for word address location 0, word address location 1, and word address location 2 shown in FIG. 1 indicates a typical efficient storage arrangement for this mixture of information. Each instruction includes an operation code (OP-CODE) that specifies the particular operation to be performed. In addition, an instruction may include one or more operand specifiers depending on the type of instruction. Although the length of a particular instruction or data word may vary depending on the number of bytes it comprises as shown in FIG. 2, each memory address location in the preferred embodiment word organized Memory Array 106 contains 4 bytes or a total of 32 bits. This means that a portion of an instruction or data may be stored in one memory location and the balance may be stored in a successive memory location in order to achieve efficient utilization of the total memory storage capacity available in a given Memory Array 106

Each column of bytes, as shown in the Memory Array 106 in FIG. 1, is addressed independently of the other columns by one of the Adders 110, 112, 114 and 116. The Word Address MSBS 118 signals for a memory location to be referenced consist of all the memory address bits except the $\log_2 N$ least significant bits and they are applied to the input of each Adder 110 to 116. In the present embodiment where there are four bytes in one memory location word, N = 4 and $\log_2 (4)$ results in 2 least significant bits which become the Memory Address LSBS 120 signals. Each Adder 110 to 116 either passes the Word Address MSBS 118 signals unmodified or increments the word address by one via Carry-in Lines 128–134 from the Word Boundary Decoder 124 which decodes the Memory Address LSBS 120 signals and the Word Byte Size 122 signals.

Since the preferred embodiment comprises 4 bytes per memory location, provision has been made for referencing 8 bytes in two memory cycles when said 8 bytes are stored within three successive memory locations. Referring again to FIG. 1, if an 8-byte string located in byte references BR2, BR3, BR4, BR5, BR6, BR7, BR8, and BR9 is referenced, the first memory cycle will reference BR2, BR3, BR4, BR5. Control signal INC 148 is asserted during the first and second memory cycles effectively causing the starting Word Address MSBS 118 to be incremented two times and thereby addressing byte references BR6, BR7, BR8, and BR9 during the second cycle.

Referring now to FIG. 3, the Memory Array 106 comprises four 64×4 random access memories (RAMs) 150, 152, 154, 156, such as the Type 93419 integrated circuits, each RAM comprising a plurality of storage locations. In larger memory implementations, each RAM would be replaced with a plurality of RAM banks. Each RAM (or bank of RAMs) receives a byte of data from the Bi-directional Multiplexer 104 during write operations, and outputs a byte of data to the Bi-directional Multiplexer 104 during read operations. The RAM read and write enables are controlled by the Column Enable Decoder 108. The RAM Word Addresses 140, 142, 144, 146 provided by the Adders are connected to the most significant address bits ($A_0$ and $A_1$) of the RAMs 150 to 156. One skilled in the art will recognize that the number of address bits is determined by the number of memory storage locations to be used in a RAM or bank of RAMs. In FIG. 3, only two address bits ($A_0$ and $A_1$) of each RAM 150 to 156 are used, but others may readily be connected.

Figure 4:
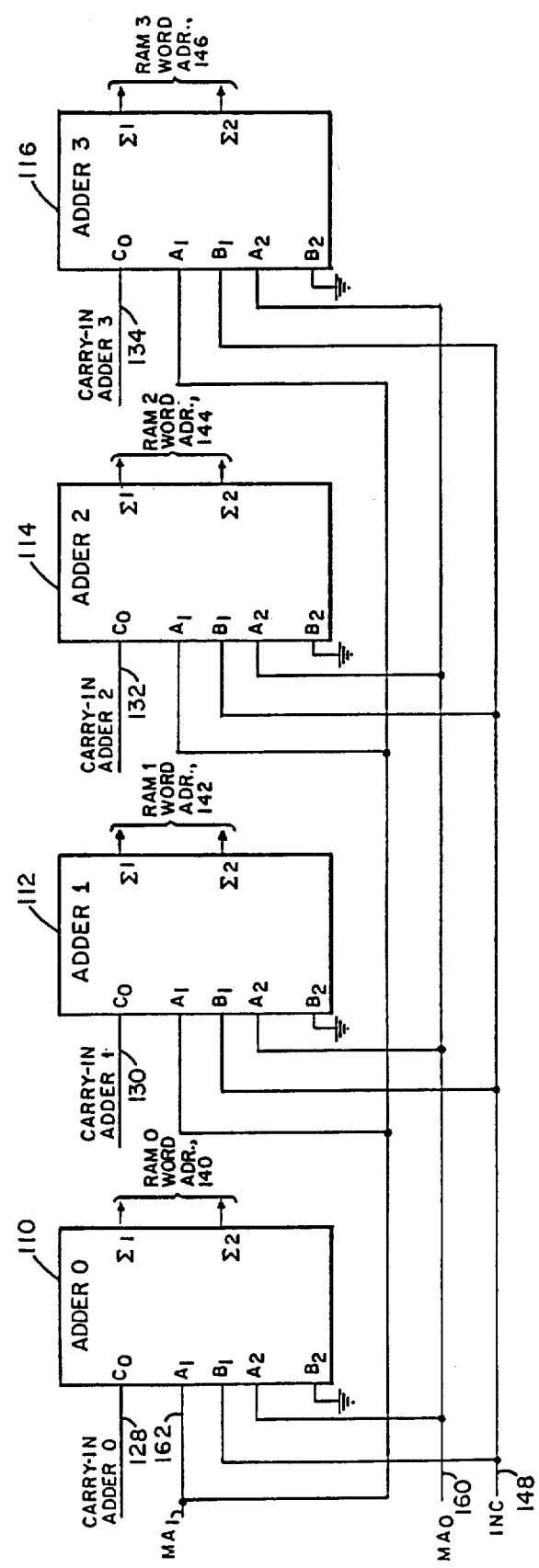
FIG. 4 is a block diagram of the adders shown in FIG. 1.

The Adders 110, 112, 114, 116, are shown in more detail in FIG. 4. They generate the RAM Word Addresses 140, 142, 144, 146 for addressing each word address location in the Memory Array 106 under the control of the Word Boundary Decoder 124. Each adder may, for example, be embodied as a Type 5482 integrated circuit if only two address bits were required. The Carry-in Signals 128, 130, 132, 134 to each adder from the Word Boundary Decoder 124 provide the capability of adding 1 to the Word Address MSBS 118 signals represented by lines $MA_0$ 160 and $MA_1$ 162 in order to perform two memory references within one memory cycle. An INC Signal 148 provides the capability of adding a second 1 to all RAM word addresses simultaneously thereby enabling a total of three RAM addresses to be generated for referencing 8 byte instructions or data. Each adder of the Type 5482 integrated circuit has the capability of performing the addition of two 2-bit binary numbers. For memory arrays requiring more RAM, word address bits which generally would be the case, higher density integrated circuit adders or combinations thereof may readily be utilized by one skilled in the art.

Figure 5:
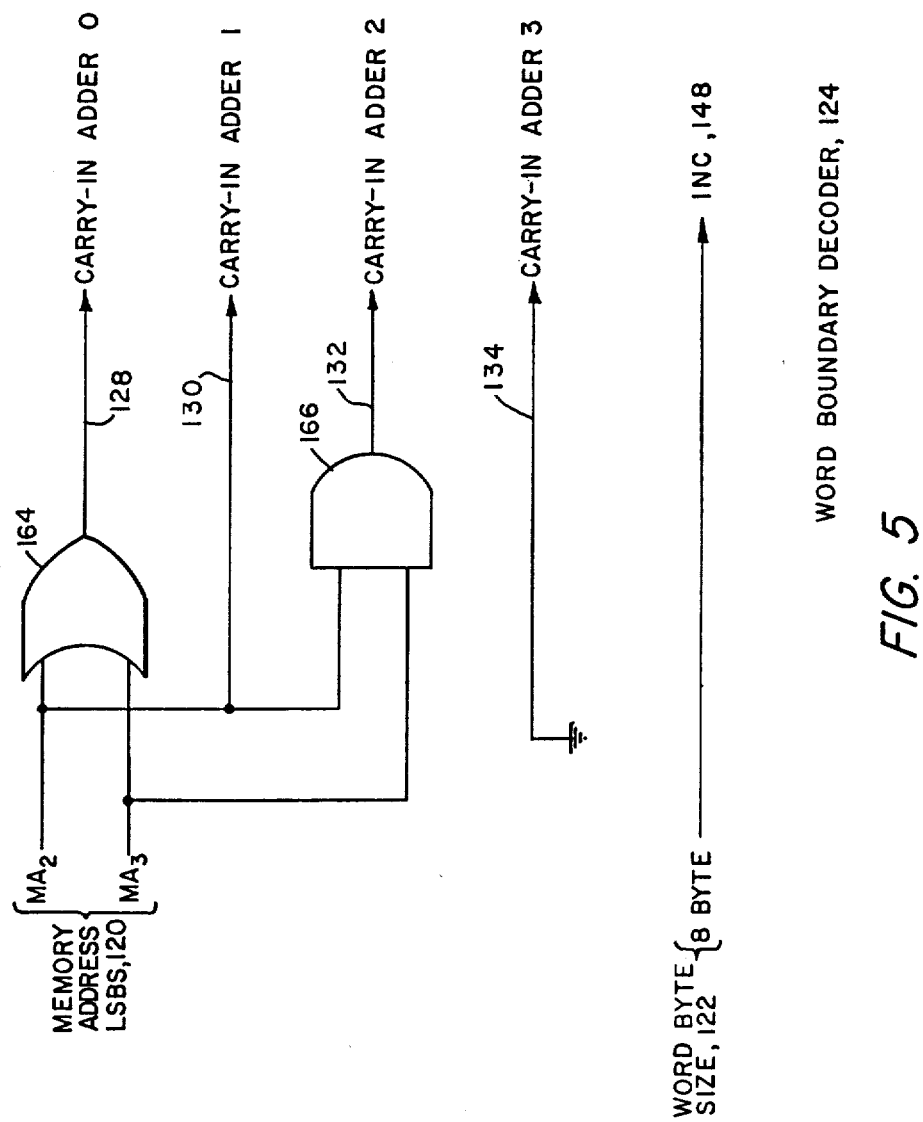
FIG. 5 is a logic diagram of the word boundary decoder shown in FIG. 1.

Referring now to FIG. 5, the logic circuit for the Word Boundary Decoder 124 is shown. This decoder comprising NOR gate 164 and NAND gate 166 controls the action of the Adders 110-116 as a function of the LSBs of the memory address and the byte size of the instruction or data memory reference. If both memory address LSBs, $MA_2$ and $MA_3$, are true, than a carry-in will be produced to Adder 0, Adder 1 and Adder 2 on lines 128, 130 and 132, thereby adding one to the associated Word Address MSBS 118. If only LSB $MA_2$ is true, than a carry-in will be produced to Adder 0 and Adder 1 on line 128 and 130, thereby adding one to the associated Word Address MSBS 118. If only LSB $MA_3$ is true, than a carry-in will be produced to Adder 0 on line 128, thereby adding one to the associated Word Address MSBS 118. The carry-in to Adder 3 on line 134 is always false. The INC 148 signal in the present embodiment is one of the Word Byte Size 122 signals. It is a control signal generated during the second half of a two cycle 8 byte memory reference, thereby adding one to all associated word addresses.

The detail combinational logic networks for the Column Enable Decoder 108 are shown in FIG. 6A (gates 210-230 and inverters 228-230) and FIG. 6B (gates 240-256 and inverters 258 and 260). This decoder generates the write enable and the output or chip enable for each RAM 150-156 shown in FIG. 3 as a function of the memory reference size (1 byte or 4 byte) and LSBs ($MA_2$ and $MA_3$) of the memory address. The control signals 1 byte 170, 2 byte 172, and 4 byte 174 are provided by the Word Byte Size 122 input word and they identify the number of bytes in a memory reference. The starting memory byte location is specified by the Memory Address LSBS 120 signals which in the present embodiment comprise $MA_2$ and $MA_3$. When the information stored in a memory location of the Memory Array 106 is to be read out, an output or chip enable signal such as $\overline{CE\ RAM}$ "R" is generated where "R" is the RAM reference designation number 0, 1, 2, or 3, causing a RAM to perform a read cycle. When information is to be stored in a Memory Array 106, an output signal $\overline{CE\ RAM}$ "R" is ANDed with control signals $\overline{WRITE}$ 176 and $\overline{WRITE\ PLS}$ 178 causing the $\overline{WE\ RAM}$ "R" signals to be generated which causes a RAM to perform a write cycle.

Referring now to FIG. 7, the detail combinational logic comprising gates 270-280 and inverter 282 for the Aligner Decoder 100 is shown. The Aligner Decoder 100 logic design is such that if a memory reference is not for one byte or four bytes of information, then the circuit generates output signals as if two bytes are requested. The Aligner Decoder 100 generates the Select A and Select B signals for the Bi-directional Multiplexer 104 as a function of the Memory Address LSBS 120 signals ($MA_2$ and $MA_3$) and the Word Byte lize 122 signals (1 Byte 170 and 4 Byte 174). The Input-Output Mux Sel A 180 signal is used for both the Input Multiplexer 190 and the Output Multiplexer 192 of the Bi-directional Multiplexer 104 while the Input Mux Sel B 184 is derived from the Output Mux Sel B 182 signal and the Input-Output Mux Sel A 180 signal.

The Input Multiplexer 190 and Output Multiplexer 192 comprising the Bi-directional Multiplexer 104 are shown in FIG. 8 and Table 1 contains the connections to multiplexer inputs $C_0$, $C_1$, $C_2$ and $C_3$ as shown in FIG. 9. Bi-directional Multiplexer 104 rotates bytes into the proper order during memory reference read and write operations. The Output Multiplexers 192 are active during memory read operation; they comprise thirty-two 4:1 multiplexers, each of which may be embodied as a Type 74LS353 integrated circuit. The control signal $\overline{READ}$ 194, which indicates that the Memory Array 106 is performing a read cycle is used to control the output enable of the Output Multiplexer 192. The Output Multiplexer 192 Select Lines A 196 and B 198 are controlled by the Aligner Decoder 100; the Input-Output Mux Sel A 180 signal connects to Select A line 196 and the Output Mux Sel B, 182 signal connects to the Select B line 198. The Input Multiplexers 190 are active during memory write operations; they comprise thirty-two 4:1 multiplexers, each of which may be embodied as a Type 74LS153 integrated circuit. The Aligner Decoder 100 also controls the select lines A 200 and B 202 of the Input Multiplexer 190; the Input-Output Mux Sel A 180 signal connects to Select A line 200 and the Input Mux Sel B 184 signal connects to the Select B line 202. Table 1 also indicates which memory bus bits are connected to each Input Multiplexer 190 and which RAM Data Out bits are connected to each Output Multiplexer 192.

The operation of the byte addressable memory invention shown in FIG. 1 can be explained by using as an example the referencing of a four byte data string in one memory cycle located in byte references BR6, BR7, BR8 and BR9 of Memory Array 106. The memory address for this data string is separated into a most significant bit part and a least significant bit part which are called Word Address MSBS 118 signals and Memory Address LSBS 120 signals respectively. The Word Address MSBS 118 signals are connected to each one of the Adders 110, 112, 114, 116 and select a word address location in the Memory Array 106 such as Word Address Location 1 in this example, which is where BR6 and BR7 are located in addition to BR4 and BR5 which are not wanted.

In order to select the desired bytes such as BR6 and BR7, the Word Byte Size 122 signals are provided to identify the number of bytes in the memory address being referenced which is four bytes in the present example. This is important because in this example the information of the referenced memory address is partially located in two memory locations, that is, BR6 and BR7 are stored in Word Address Location 1 and BR8 and BR9 are stored in Word Address Location 2. The Word Address MSBS 118 signals pass through Adder 114 and Adder 116 causing BR6 and BR7 in Word Address Location 1 to be referenced. During the same memory cycle, the Word Address MSBS 118 signals are incremented by 1 when passing through ADDER 110 and ADDER 112 as a result of Word Boundary Decoder 124 which results in BR8 and BR9 being referenced in Word Address Location 2. The writing or reading of the proper number of information bytes to or from a location in the Memory Array 106 also is determined by the Column Enable Decoder 108 which generates output enable (read) signals such as $\overline{\text{CE RAM O}}$ 149 or a write enable signal such as $\overline{\text{WE RAM O}}$ 147. When the output enable or read signals are generated, the referenced bytes will appear at the input-output ports of the Memory Array 106 in the order BR8, BR9, BR6 and BR7. Then the Bi-directional Multiplexer 104 under the control of the Aligner Decoder 100 rearranges the order to achieve the byte order BR6, BR7, BR8, BR9 on the 32 Bit (4-Byte) Memory Data Bus 102 interface. Initially in this example when the contents of BR6, BR7, BR8 and BR9 were stored in Memory Array 106 by a write operation, the information appeared on the 32 bit (4 byte) Memory Data Bus 102 in the order BR6, BR7, BR8, BR9. The Bi-directional Multiplexer immediately rearranged the byte order to BR8, BR9, BR6, BR7 in order to direct BR6 and BR7 into the second half of Word Address Location 1 and BR8 and BR9 into the first half of Word Address Location 2 of Memory Array 106.

In the case where an 8-byte string of information located in BR2, BR3, BR4, BR5, BR6, BR7 and BR8 is to be read from Memory Array 106, the operation for obtaining byte references BR2, BR3, BR4, BR5 is as described hereinbefore during the first memory cycle. During a second memory cycle, a control signal INC 148 is generated which causes an additional 1 to be added to the Word Address MSBS 118 signals passing through Adders 110, 112, 114, 116 which results in addressing BR6, BR7, BR8 and BR9 in a similar manner as described hereinbefore with the Bi-Directional Multiplexer 104 again performing the appropriate reordering.

This concludes the description of the preferred embodiment. However, many modifications and alterations will be obvious to one of ordinary skill in the art without departing from the spirit and scope of the inventive concept. For example, although the preferred embodiment is described utilizing a read-write random access memory (RAM) array element, a read-only memory (ROM) integrated circuit chip may also be used to implement the memory array; such a chip of course will not require any write control signals and the speed and storage efficiencies achieved by this invention will be realized for a ROM memory. The total storage capacity needed in the RAMs or ROMs will vary depending on application requirements; the number of bits or bytes in a word may vary as well as the total number of words. As the storage capacity increases, the number of address bits will increase requiring multiple bit adders or banks of adders for incrementing the memory reference address. In addition, all of the integrated circuits required to implement the present invention may be implemented on one large scale integrated (LSI) chip. Therefore, it is intended that the scope of this invention be limited only by the appended claims.

What is claimed is:

1. In combination:
   memory means for storing in a plurality of word locations variable length digital words, each of said words having at least one byte and each one of said word locations comprising a plurality of byte positions, a first byte of one of said digital words being stored at any one of said byte positions of one of said word locations and any remaining bytes of said one of said digital words being stored in any remaining successive byte positions of said one of said word locations and in byte positions of one or more successive word locations as required to store said one of said digital words;
   means for providing a first address to select one of said word locations;
   means for providing a second address to select a first one of said byte positions in said one of said word locations;
   means for providing a third address to select a number of said byte positions in said one of said word locations starting at said second address;
   means for incrementing said first address to enable more than one of said word locations to be addressed during one memory cycle;
   first decoding means coupling to said incrementing means and responsive to said second address and said third address for producing control signals for said incrementing means;
   second decoding means responsive to said second address and said third address for providing read and write enable signals to each of said byte positions in said word locations of said memory means;
   means coupled to said memory means for transferring said digital words to or from said memory means; and
   third decoding means coupled to said digital words transferring means and responsive to said second address and said third address for producing control signals for rearranging an order of said bytes of said one of said digital words transferring from said memory means, and for enabling said first byte of said one of said digital words to be stored at any of said byte positions of one of said word locations and subsequent bytes to be stored in subsequent byte positions of said one of said word locations or in subsequent byte positions of successive word locations in accordance with the quantity of said bytes in said one of said digital words.

2. The combination as recited in claim 1 wherein:

said second address comprises one or more bits determined by a $\log_2 N$ where N equals a fixed number of said byte positions in one of said word locations of said memory means.

3. The combination as recited in claim 1 wherein:

said incrementing means comprises an adder.

4. The combination as recited in claim 1 wherein:

said incrementing means control signals produced by said first decoding means enables a first portion of one of said digital words to be stored in or read from a first one of said word locations and a second portion of said one of said digital words to be stored in or read from a second successive one of said word locations within one memory cycle.

5. The combination as recited in claim 1 wherein:

said digital words transferring means comprises bidirectional multiplexer coupled to said third decoding means.

6. In combination:

memory means for storing in a plurality of word locations variable length digital words, each of said words having at least one byte and each one of said word locations comprising a plurality of byte positions, a first byte of one of said digital words being stored at any one of said byte positions of one of said word locations and any remaining bytes of said one of said digital words being stored in any remaining successive byte positions of said one of said word locations and in byte positions of one or more successive word locations as required to store said one of said digital words;

means for providing a first address to select one of said word locations;

means for providing a second address to select a first one of said byte positions in said one of said word locations;

means for providing a third address to select a number of said byte positions in said one of said word locations strating at said second address;

means for incrementing said first address to enable more than one of said word locations to be addressed during one mrmory cycle;

said incrementing means comprising means for incrementing said first address at least twice within two memory cycles for writing or reading a plurality of said bytes of said one of said digit words into or from three of said successive word locations of said memory means;

first decoding means coupling to said incrementing means and responsive to said second address and said third address for producing control signals for said incrementing means;

second decoding means responsive to said second address and said third addrss for providing read and write enable signals to each of said byte positions in said word locations of said memory means;

means coupled to said memory means for transferring said digital words to or from said memory means; and third decoding means coupled to said digital words transferring means and responsive to said second address and said third address for producing control signals for rearranging an order of said bytes of said one of said digital words transferring from said memory means, and for enabling said first byte of one of said digital words to be stored at any one of said byte positions of one of said word locations and subsequent bytes to be stored in subsequent byte positions of said one of said word locations or in subsequent byte positions of successive word locations or in subsequent byte positions of successive word locations in accordance with the quantity of said bytes in said one of said digital words.

7. The combination as recited in claim 6 wherein:

said second address comprises one or more bits determined by a $\log_2 N$ where N equals a fixed number of said byte positions in one of said addressable word locations of said memory means.

8. The combination as recited in claim 6 wherein:

said incrementing means comprises an adder.

9. The combination as recited in claim 8 wherein:

said adder further comprises an incrementing control signal means for incrementing said first address at least twice within said two memory cycles.

10. The combination as recited in claim 6 wherein:

said incrementing means control signals produced by said first decoding means enables a first portion of one of said digital words to be stored in or read from a first one of said word locations and a second portion of said one of said digital words to be stored in or read from a second successive one of said word locations within one memory cycle.

11. The combination as recited in claim 6 wherein said digital words transferring means comprises a bidirectional multiplexer coupled to said third decoding means.

* * * * *